United States Patent
Li et al.

(10) Patent No.: US 9,312,427 B2
(45) Date of Patent: Apr. 12, 2016

(54) SEMICONDUCTOR STRUCTURE AND METHOD FOR FORMING THE SAME (71) Applicants: Yuan Li, Beijing (CN); Lei Guo, Beijing (CN)

(72) Inventors: Yuan Li, Beijing (CN); Lei Guo, Beijing (CN)

( * ) Notice: Subject to any disclaimer, the term of this patent is extended or adjusted under 35 U.S.C. 154(b) by 0 days.

(21) Appl. No.: 14/362,079

(22) PCT Filed: Nov. 15, 2012

(86) PCT No.: PCT/CN2012/084694
§ 371 (c)(1),
(2) Date: May 30, 2014

(87) PCT Pub. No.: WO2013/078950
PCT Pub. Date: Jun. 6, 2013

(65) Prior Publication Data
US 2014/0319657 A1  Oct. 30, 2014

(30) Foreign Application Priority Data

Nov. 30, 2011  (CN) .......................... 2011 1 0389557

(51) Int. Cl.
*H01L 29/06* (2006.01)
*H01L 33/00* (2010.01)
*H01L 33/16* (2010.01)
*H01L 33/20* (2010.01)

(52) U.S. Cl.
CPC .......... *H01L 33/0062* (2013.01); *H01L 33/007* (2013.01); *H01L 33/16* (2013.01); *H01L 33/20* (2013.01)

(58) Field of Classification Search
CPC ................... H01L 2924/0002; H01L 2924/00; H01L 21/02603; H01L 29/0665; H01L 29/0673; H01L 33/18; H01L 33/24; H01L 21/02639; H01L 21/0237; H01L 21/02458; H01L 21/0254; H01L 21/0262; H01L 21/02636
See application file for complete search history.

(56) References Cited

U.S. PATENT DOCUMENTS 5,753,536 A * 5/1998 Sugiyama et al. ............ 438/108
(Continued)

FOREIGN PATENT DOCUMENTS

| CN | 1119345 A | 3/1996 |
|----|-----------|--------|
| CN | 102427101 A | 4/2012 |

OTHER PUBLICATIONS

English language abstract for CN1119345A extracted from espacenet.com on Jun. 29, 2015, 2 pages.
(Continued)

*Primary Examiner* — Robert Bachner
(74) *Attorney, Agent, or Firm* — Howard & Howard Attorneys PLLC (57) ABSTRACT

A semiconductor structure and a method for forming the same are provided. The semiconductor structure comprises: a substrate (100); and a plurality of zigzag structures (200) formed on a surface of the substrate (100), in which each zigzag structure (200) has a first long side (202) and a first short side (204), the first long side (202) of one zigzag structure (200) is adjacent to the first short side (204) of another zigzag structure (200) adjacent to the one zigzag structure (200), each first long side (202) defines a first surface (300) of each zigzag structure (200), each first short side (204) defines a second surface (302) of each zigzag structure, and each first surface (300) is a growth surface for a compound semiconductor layer.

8 Claims, 3 Drawing Sheets

(56) References Cited

U.S. PATENT DOCUMENTS

| 7,183,603 | B2 | 2/2007 | Park | |
|---|---|---|---|---|
| 2007/0085093 | A1* | 4/2007 | Ohmae et al. | 257/89 |
| 2007/0164292 | A1* | 7/2007 | Okuyama | 257/79 |
| 2009/0159907 | A1* | 6/2009 | Wang | 257/94 |
| 2009/0227063 | A1* | 9/2009 | Ravi et al. | 438/73 |

OTHER PUBLICATIONS

English language abstract for CN102427101A extracted from espacenet.com on Jun. 29, 2015, 1 page.

International Search Report of WO2013078950A1 dated Jan. 13, 2013, 2 pages.

\* cited by examiner

SEMICONDUCTOR STRUCTURE AND METHOD FOR FORMING THE SAME

CROSS-REFERENCE TO RELATED APPLICATIONS

This application is the National Stage of International Patent Application No. PCT/CN2012/084694, filed on Nov. 15, 2012, which claims priority to and all the benefits of Chinese Patent Application No. 201110389557.5, filed on Nov. 30, 2011, the content of which is incorporated herein by reference.

FIELD

The present disclosure relates to semiconductor design and fabrication field, and more particularly to a semiconductor structure and a method for forming the same.

BACKGROUND

A GaN crystal material is primarily used in conventional blue light and white light light-emitting diode (LED) products. A common technology for fabricating a light emitting layer of an active region of an LED epitaxial wafer is an epitaxial growth of the (0001) GaN crystal on a (0001) sapphire crystal substrate or a (111) silicon substrate. Because the crystal plane (0001) (perpendicular to a c axis) of the GaN crystal is polar, according to common LED device structures, a polar material may greatly reduce a quantum efficiency of the light emitting layer, thus greatly reducing a light emitting efficiency. Therefore, the quantum efficiency may be greatly raised by using a GaN LED device of a non-polar plane. However, a dislocation density of a GaN film, which has a non-polar a-plane or m-plane and is formed on the sapphire or silicon substrate by epitaxy, is a few orders of magnitude higher than that of the conventional (0001) GaN crystal because of factors such as lattice mismatch, so that it is difficult to apply the GaN LED device of the non-polar plane in a large scale production.

In addition, in a fabrication technology of a semiconductor device, it is generally needed to fabricate a specific crystal plane on a substrate to form a special three-dimensional structure. By coating a planar photoresist on a wafer substrate, transferring a planar pattern onto a photoresist mask by lithography, and then etching, a required structure such as a recess or a trench may be obtained with a conventional microfabrication technology. However, some special three-dimensional structures cannot be fabricated by the technology based on the planar process, and only some extremely special crystal planes, such as (111) of silicon, may be obtained by using an anisotropy characteristic of a wet etching. However, any crystal plane, such as (337), (5 5 12), (113), (211) or (100) of silicon, cannot be fabricated on any orientation substrate.

SUMMARY

The present disclosure is aimed to solve at least one of the problems. Particularly, a semiconductor structure with a non-polar or semi-polar plane on a substrate and a method for forming the same are provided, in order to solve a problem of a reduction of a light emitting efficiency caused by the fact that a polar material is used to fabricate a light emitting layer of an active region of an LED epitaxial wafer. Furthermore, a method for forming any required crystal plane on the substrate to fabricate a special three-dimensional structure is also provided.

According to a first aspect of the present disclosure, a semiconductor structure is provided. The semiconductor structure comprises: a substrate; and a plurality of zigzag structures formed on a surface of the substrate, in which each zigzag structure has a first long side and a first short side, the first long side of one zigzag structure is adjacent to the first short side of another zigzag structure adjacent to the one zigzag structure, each first long side defines a first surface of each zigzag structure, each first short side defines a second surface of each zigzag structure, and each first surface is a growth surface for a compound semiconductor layer.

In one embodiment, a first mask layer is formed on each second surface to prevent the compound semiconductor layer from growing on each second surface.

In one embodiment, each zigzag structure has a porous structure.

In one embodiment, a surface of each porous structure is a plane formed by annealing in an ambient containing hydrogen.

In one embodiment, a material of the compound semiconductor layer comprises a nitride-based compound semiconductor material, such as GaN, so as to enable the semiconductor structure to be suitable for fabricating the light emitting layer of the active region of a nitride-based LED epitaxial wafer.

In one embodiment, each zigzag structure is formed by a nanoimprint lithography process.

In one embodiment, a height of the compound semiconductor layer grown on each first surface in a direction perpendicular to each first surface is not greater than a length of each first short side so as to enable the compound semiconductor layers formed on adjacent first surfaces to be separated from each other; or the height of the compound semiconductor layer grown on each first surface in the direction perpendicular to each first surface is greater than the length of each first short side so as to enable the compound semiconductor layers formed on adjacent first surfaces to be connected with each other to form a global compound semiconductor layer.

In one embodiment, the substrate is a silicon substrate; the surface of the substrate is any crystal plane of {110}, {111}, {001}, {211}, {311}, {337} and {5 5 12} families of planes; and each first surface is any crystal plane of {111} and {110} families of planes, so as to enable the semiconductor structure to be suitable for fabricating the light emitting layer of the active region of the LED epitaxial wafer.

In one embodiment, the substrate is a sapphire substrate; and the surface of the substrate is any crystal plane of $\{1\bar{1}02\}$, $\{11\bar{2}3\}$, $\{10\bar{1}0\}$ and $\{11\bar{2}1\}$ families of planes, and each first surface is a crystal plane (0001); or the surface of the substrate is any crystal plane of $\{10\bar{1}0\}$ and $\{11\bar{2}0\}$ families of planes, and each first surface is any crystal plane of $\{1\bar{1}02\}$, $\{11\bar{2}3\}$, $\{10\bar{1}0\}$ and $\{11\bar{2}1\}$ families of planes, so as to enable the semiconductor structure to be suitable for fabricating the light emitting layer of the active region of the LED epitaxial wafer.

According to a second aspect of the present disclosure, a method for forming the semiconductor structure is provided. The method comprises steps of: providing a mold having a pattern matched with a plurality of zigzag structures, in which each zigzag structure has a first long side and a first short side, the first long side of one zigzag structure is adjacent to the first short side of another zigzag structure adjacent to the one zigzag structure, each first long side defines a first surface of each zigzag structure, and each first short side defines a second surface of each zigzag structure; providing a substrate and forming a photosensitive or thermosensitive material layer on the substrate; pressing the mold onto the photosensitive or thermosensitive material layer to fill the photosensitive or thermosensitive material layer into the pattern of the mold; curing the photosensitive or thermosensitive material layer by irradiating or heating to form a patterned second mask layer on the substrate; and etching the patterned second mask layer and the substrate to transfer the pattern to the substrate so as to form the plurality of zigzag structures on a surface of the substrate.

In one embodiment, after forming the plurality of zigzag structures, the method further comprises: forming a first mask layer on each second surface.

In one embodiment, after forming the plurality of zigzag structures, the method further comprises: growing a compound semiconductor layer on each first surface by using each first surface as a growth surface.

In one embodiment, a material of the compound semiconductor layer comprises a nitride-based compound semiconductor material, such as GaN, so as to enable the semiconductor structure to be suitable for fabricating the light emitting layer of the active region of a nitride-based LED epitaxial wafer.

In one embodiment, a height of the compound semiconductor layer grown on each first surface in a direction perpendicular to each first surface is not greater than a length of each first short side so as to enable the compound semiconductor layers formed on adjacent first surfaces to be separated from each other; or the height of the compound semiconductor layer grown on each first surface in the direction perpendicular to each first surface is greater than the length of each first short side so as to enable the compound semiconductor layers formed on adjacent first surfaces to be connected with each other to form a global compound semiconductor layer.

In one embodiment, after forming the plurality of zigzag structures, the method further comprises: anodizing each zigzag structure to form a porous structure; and annealing each porous structure in an ambient containing hydrogen to form a surface of each porous structure as a plane.

In one embodiment, the substrate is a silicon substrate; the surface of the substrate is any crystal plane of $\{110\}$, $\{111\}$, $\{001\}$, $\{211\}$, $\{311\}$, $\{337\}$ and $\{5\ 5\ 12\}$ families of planes; and each first surface is any crystal plane of $\{111\}$ and $\{110\}$ families of planes, so as to enable the semiconductor structure to be suitable for fabricating the light emitting layer of the active region of the LED epitaxial wafer.

In one embodiment, the substrate is a sapphire substrate; and the surface of the substrate is any crystal plane of $\{1\bar{1}02\}$, $\{11\bar{2}3\}$, $\{10\bar{1}0\}$ and $\{11\bar{2}1\}$ families of planes, and each first surface is a crystal plane (0001); or the surface of the substrate is any crystal plane of $\{10\bar{1}0\}$ and $\{11\bar{2}0\}$ families of planes, and each first surface is any crystal plane of $\{1\bar{1}02\}$, $\{11\bar{2}3\}$, $\{10\bar{1}0\}$ and $\{11\bar{2}1\}$ families of planes, so as to enable the semiconductor structure to be suitable for fabricating the light emitting layer of the active region of the LED epitaxial wafer.

According to a third aspect of the present disclosure, a method for forming the semiconductor structure is provided. The method comprises steps of: providing a mold having a pattern matched with a plurality of zigzag structures, in which each zigzag structure has a first long side and a first short side, the first long side of one zigzag structure is adjacent to the first short side of another zigzag structure adjacent to the one zigzag structure, each first long side defines a first surface of each zigzag structure, and each first short side defines a second surface of each zigzag structure; providing a substrate and forming a thermoplastic material layer on the substrate; heating the thermoplastic material layer to a temperature above a glass transition temperature of the thermoplastic material, and pressing the mold onto the thermoplastic material layer to fill the thermoplastic material layer into the pattern of the mold; curing the thermoplastic material layer by cooling and then removing the mold to form a patterned third mask layer on the substrate; and etching the patterned third mask layer and the substrate to transfer the pattern to the substrate so as to form the plurality of zigzag structures on the surface of the substrate.

In one embodiment, after forming the plurality of zigzag structures, the method further comprises: forming a first mask layer on each second surface.

In one embodiment, after forming the plurality of zigzag structures, the method further comprises: growing a compound semiconductor layer on each first surface by using each first surface as a growth surface.

In one embodiment, a material of the compound semiconductor layer comprises a nitride-based compound semiconductor material, such as GaN, so as to enable the semiconductor structure to be suitable for fabricating the light emitting layer of the active region of a nitride-based LED epitaxial wafer.

In one embodiment, a height of the compound semiconductor layer grown on each first surface in a direction perpendicular to each first surface is not greater than a length of each first short side so as to enable the compound semiconductor layers formed on adjacent first surfaces to be separated from each other; or the height of the compound semiconductor layer grown on each first surface in the direction perpendicular to each first surface is greater than the length of each first short side so as to enable the compound semiconductor layers formed on adjacent first surfaces to be connected with each other to form a global compound semiconductor layer. In one embodiment, after forming the plurality of zigzag structures, the method further comprises: anodizing each zigzag structure to form a porous structure; and annealing each porous structure in an ambient containing hydrogen to form a surface of each porous structure as a plane.

In one embodiment, the substrate is a silicon substrate; the surface of the substrate is any crystal plane of $\{110\}$, $\{111\}$, $\{001\}$, $\{211\}$, $\{311\}$, $\{337\}$ and $\{5\ 5\ 12\}$ families of planes; and each first surface is any crystal plane of $\{111\}$ and $\{110\}$ families of planes, so as to enable the semiconductor structure to be suitable for fabricating the light emitting layer of the active region of the LED epitaxial wafer.

In one embodiment, the substrate is a sapphire substrate; and the surface of the substrate is any crystal plane of $\{1\bar{1}02\}$, $\{11\bar{2}3\}$, $\{10\bar{1}0\}$ and $\{11\bar{2}1\}$ families of planes, and each first surface is a crystal plane (0001); or the surface of the substrate is any crystal plane of $\{10\bar{1}0\}$ and $\{11\bar{2}\}$ families of planes, and each first surface is any crystal plane of $\{1\bar{1}02\}$, $\{11\bar{2}3\}$, $\{10\bar{1}\}$ and $\{11\bar{2}1\}$ families of planes, so as to enable the semiconductor structure to be suitable for fabricating the light emitting layer of the active region of the LED epitaxial wafer.

With the semiconductor structure according to an embodiment of the present disclosure, by introducing a plurality of growth planes (i.e., the first surface and/or the second surface of each zigzag structure) on a substrate which are at a determinate angle to the original crystal plane of the substrate and are suitable for epitaxial growth in subsequent processes, a high-quality film is easily obtained by epitaxially growing on the plurality of growth planes, thus reducing a dislocation density of an epitaxial layer. During the epitaxial process, by process controlling, the surface plane of the epitaxial film may be gradually changed from being parallel to the first surface of each zigzag structure to being parallel to the original crystal plane of the substrate, which means that the surface of the epitaxial film may be non-polar or semi-polar even if the growth plane is polar. Furthermore, because a surface of the film formed after the epitaxial growth may be non-polar or semi-polar, by fabricating a non-polar or semi-polar LED device on the semiconductor structure, a quantum efficiency of the light emitting layer of the active region of the LED epitaxial wafer may be greatly raised, thus raising a light emitting efficiency of the LED device greatly. In addition, with the method for forming the semiconductor structure according to embodiments of the present disclosure, the plurality of growth planes are obtained by transferring a special patterned structure onto a mask of the substrate via the nanoimprint lithography process and then pattern-preserving etching. Therefore, almost any required crystal plane may be obtained on any orientation substrate by using the method according to embodiments of the present disclosure.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Embodiments of the present disclosure will be described in detail in the following descriptions, examples of which are shown in the accompanying drawings, in which the same or similar elements and elements having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature, and may also include an embodiment in which an additional feature is formed between the first feature and the second feature so that the first feature does not directly contact the second feature.

Reference throughout this specification to "an embodiment", "some embodiments", "one embodiment", "an example", "a specific examples", or "some examples" means that a particular feature, structure, material, or characteristic described in connection with the embodiment or example is included in at least one embodiment or example of the disclosure. Thus, the appearances of the phrases such as "in some embodiments", "in one embodiment", "in an embodiment", "an example", "a specific examples", or "some examples" in various places throughout this specification are not necessarily referring to the same embodiment or example of the disclosure. Furthermore, the particular features, structures, materials, or characteristics may be combined in any suitable manner in one or more embodiments or examples.

With a semiconductor structure having a plurality of three-dimensional zigzag structures according to an embodiment of the present disclosure, by introducing a plurality of growth planes on a substrate, which are at a determinate angle to an original crystal plane of the substrate, are arranged in an array and are suitable for epitaxial growth in subsequent processes, such as a (0001) plane of sapphire or a (111) plane of silicon, a high-quality film is easily obtained by epitaxially growing on the plurality of growth planes. A compound semiconductor material layer with a required orientation is formed on the growth planes by epitaxial growth, which may have a non-polar or semi-polar surface identical with the original crystal plane of the substrate. By fabricating a non-polar or semi-polar LED device on the semiconductor structure, a quantum efficiency of the light emitting layer of the active region of an LED epitaxial wafer may be greatly raised, thus raising a light emitting efficiency of the LED device greatly.

Figure 1:
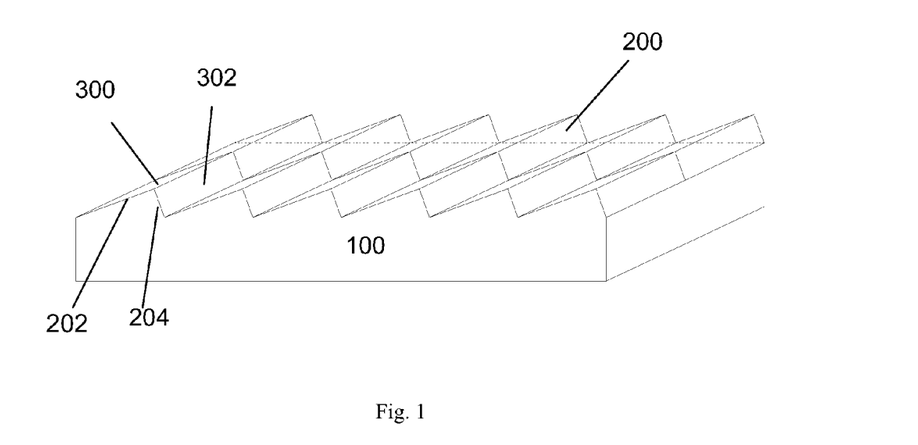
FIG. 1 is a schematic perspective view of a semiconductor structure according to an embodiment of the present disclosure.

FIG. 1 is a schematic perspective view of a semiconductor structure according to an embodiment of the present disclosure. As shown in FIG. 1, the semiconductor structure comprises: a substrate 100 and a plurality of zigzag structures 200 formed on a surface of the substrate 100. Each zigzag structure 200 has a first long side 202 and a first short side 204, the first long side 202 of one zigzag structure 200 is adjacent to the first short side 204 of another zigzag structure 200 adjacent to the one zigzag structure 200. Each first long side 202 defines a first surface 300 of each zigzag structure 200, and each first short side 204 defines a second surface 302 of each zigzag structure 200. Each first surface 300 is a growth surface for a compound semiconductor layer. It can be seen from FIG. 1 that, embodiments of the present disclosure provide a zigzag structure, which has a plurality of growth crystal planes (such as the first surfaces 300) that are at a determinate angle to an original crystal plane of the substrate 100 and are arranged in an array.

In one embodiment, a first mask layer (not shown in FIG. 1) is formed on each second surface 302 to prevent the compound semiconductor layer from growing on each second surface 302.

In one embodiment, a plurality of such zigzag structures 200 may be arranged into a two-dimensional array on the surface of the substrate 100, as shown in FIG. 1.

In one embodiment, if a height of the compound semiconductor layer grown on each first surface 300 in a direction perpendicular to each first surface 300 is not greater than a length of each first short side 204, the compound semiconductor layers formed on adjacent first surfaces 300 may be separated from each other. In another embodiment, if the height of the compound semiconductor layer grown on each first surface 300 in the direction perpendicular to each first surface 300 is greater than the length of each first short side 204, the compound semiconductor layers formed on adjacent first surfaces 300 may be connected with each other to form a global compound semiconductor layer. The separated compound semiconductor layers or the global compound semiconductor layer is the non-polar or semi-polar surface identical with the original crystal plane of the substrate.

In one embodiment, each zigzag structure 200 has a porous structure, and a surface of each porous structure is a plane formed by annealing in an ambient containing hydrogen. A flat surface plane may be formed by annealing the porous structure in the ambient containing hydrogen, which is helpful for the epitaxial growth of high quality compound semiconductor layer on the porous structure.

Figure 2:
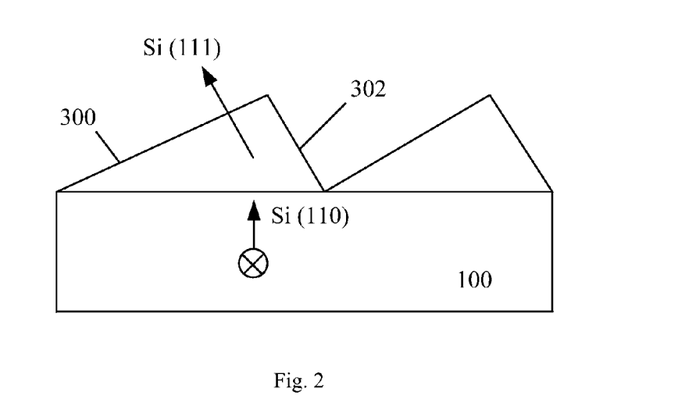
FIG. 2 is a sectional view of a semiconductor structure having a silicon substrate according to an embodiment of the present disclosure.
Figure 3:
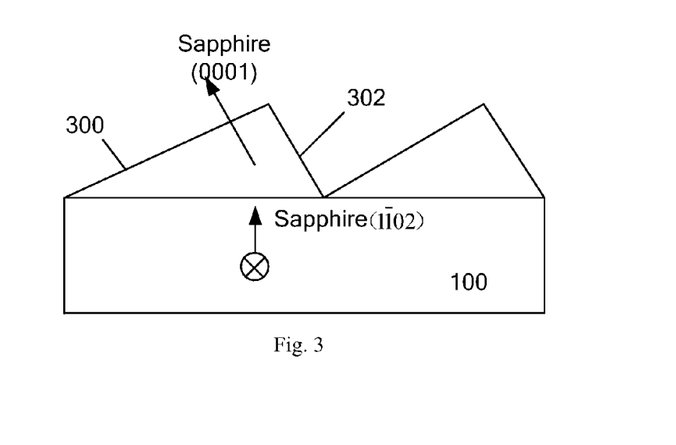
FIG. 3 is a sectional view of a semiconductor structure having a sapphire substrate according to an embodiment of the present disclosure.

In some embodiments, the semiconductor structure is preferably used for forming a light emitting layer of an active region of an LED epitaxial wafer. Therefore, in one embodiment, the substrate 100 may be a silicon substrate, and the surface of the substrate 100 may be any crystal plane of {110}, {111}, {001}, {211}, {311}, {337} and {5 5 12} families of planes, while each first surface 300 may be any crystal plane of {111} and {110} families of planes, one of which is shown in FIG. 2. In another embodiment, the substrate 100 may be preferably a sapphire substrate; and the surface of the substrate 100 may be any crystal plane of {1$\bar{1}$02}, {11$\bar{2}$3}, {10$\bar{1}$0} and {11$\bar{2}$1} families of planes, while each first surface 300 may be a crystal plane (0001); or the surface of the substrate 100 may be any crystal plane of {10$\bar{1}$0} and {11$\bar{2}$0} families of planes (i.e., m-plane and a-plane), while each first surface 300 may be any crystal plane of {1$\bar{1}$02}, {11$\bar{2}$3}, {10$\bar{1}$} and {11$\bar{2}$1} families of planes, one of which is shown in FIG. 3. A material of the compound semiconductor layer formed on each first surface 300 comprises a nitride-based compound semiconductor material, such as GaN with a non-polar or semi-polar surface, for example, an m-plane, an a-plane, or a r-plane, even if the growth plane (each first surface) is polar (such as a c-plane).

Methods for forming the semiconductor structure according to embodiments of the present disclosure are further provided, which comprise steps of transferring a patterned structure of a special shape onto a mask of the substrate via the nanoimprint lithography process and then pattern-preserving etching to obtain the required plurality of discrete planes. Almost any required crystal plane may be obtained on any orientation substrate by using the method according to the embodiments of the present disclosure. The nanoimprint lithography process may be implemented via a photosensitive, thermosensitive or thermoplastic material, which will be described below respectively.

Figure 4:
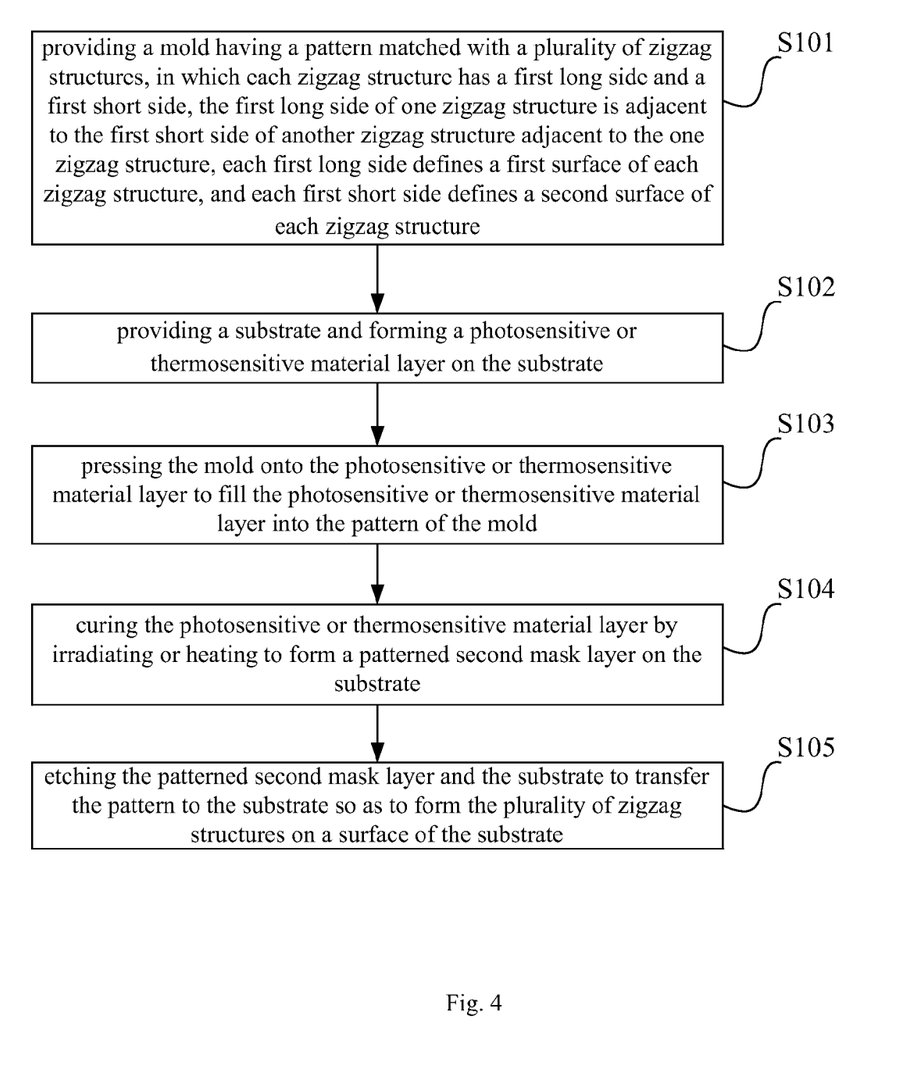
FIG. 4 is a flow chart of one method for forming a semiconductor structure according to an embodiment of the present disclosure.

FIG. 4 is a flow chart of one method for forming the semiconductor structure according to an embodiment of the present disclosure. The method comprises following steps.

Step S101: a mold having a pattern matched with a plurality of zigzag structures is provided. Each zigzag structure has a first long side and a first short side, the first long side of one zigzag structure is adjacent to the first short side of another zigzag structure adjacent to the one zigzag structure, each first long side defines a first surface of each zigzag structure, and each first short side defines a second surface of each zigzag structure. In a preferred embodiment, the plurality of zigzag structures are arranged into a two-dimensional array.

Step S102: a substrate is provided, and a photosensitive or thermosensitive material layer is formed on the substrate. In one embodiment, the semiconductor structure is preferably used for forming a light emitting layer of an active region of an LED epitaxial wafer. Therefore, the substrate may be a silicon substrate or a sapphire substrate; the surface of the silicon substrate may be any crystal plane of {110}, {111}, {001}, {211}, {311}, {337} and {5 5 12} families of planes; and the surface of the sapphire substrate may be any crystal plane of {1$\bar{1}$02}, {11$\bar{2}$3}, {10$\bar{1}$0} and {11$\bar{2}$1} families of planes, or any crystal plane of {10$\bar{1}$0} and {11$\bar{2}$0} families of planes (i.e., m-plane and a-plane).

Step S103: the mold is pressed onto the photosensitive or thermosensitive material layer to fill the photosensitive or thermosensitive material layer into the pattern of the mold.

Step S104: the photosensitive or thermosensitive material layer is cured by irradiating or heating to form a second mask layer having a three-dimensional pattern on the substrate.

Step S105: the second mask layer and the substrate are etched to transfer the pattern to the substrate so as to form the plurality of zigzag structures on a surface of the substrate. An etching method may be a dry etching or a wet etching. During the etching process, the pattern of the second mask layer is preserved and transferred to the surface of the substrate to form the required zigzag convex structures on the surface of the substrate finally.

Figure 5:
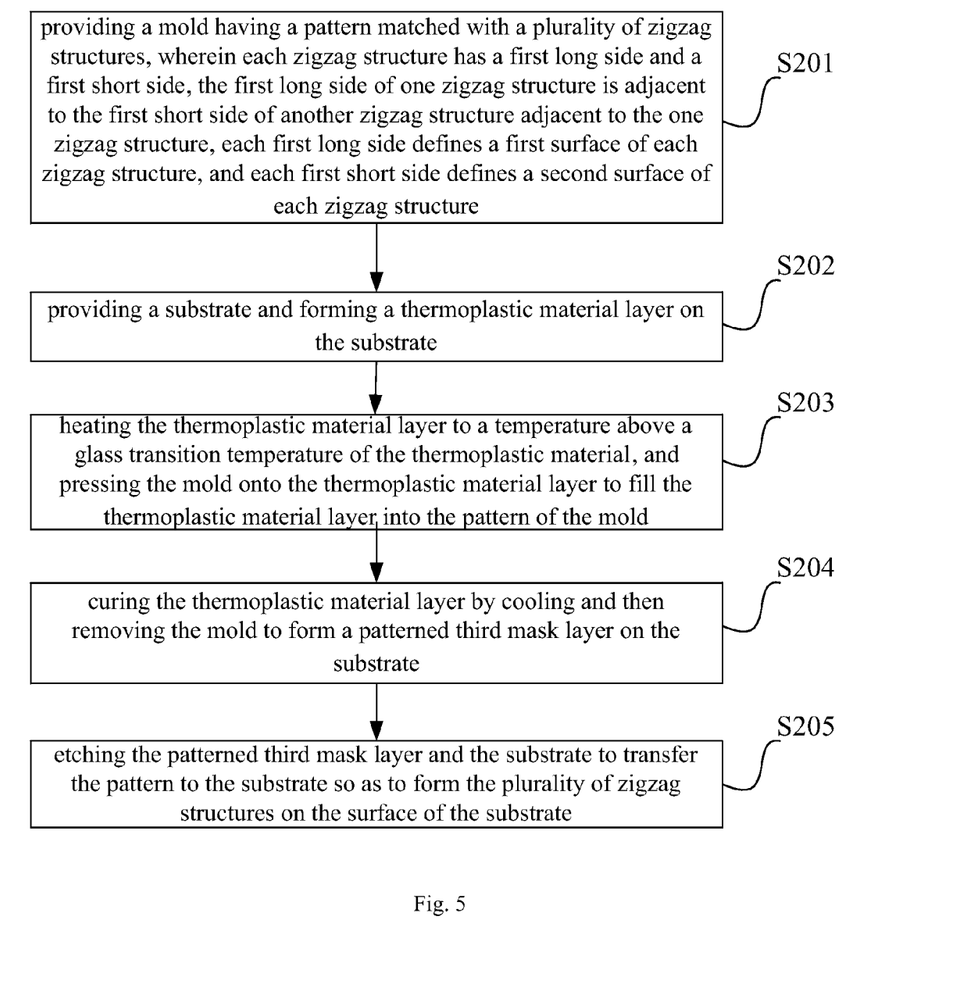
FIG. 5 is a flow chart of another method for forming a semiconductor structure according to an embodiment of the present disclosure.

FIG. 5 is a process flow chart of another method for forming the semiconductor structure according to an embodiment of the present disclosure. The method comprises following steps.

Step S201: a mold having a pattern matched with a plurality of zigzag structures is provided. Each zigzag structure has a first long side and a first short side, the first long side of one zigzag structure is adjacent to the first short side of another zigzag structure adjacent to the one zigzag structure, each first long side defines a first surface of each zigzag structure, and each first short side defines a second surface of each zigzag structure. In a preferred embodiment, the plurality of zigzag structures are arranged into a two-dimensional array.

Step S202: a substrate is provided, and a thermoplastic material layer is formed on the substrate. In one embodiment, the semiconductor structure is preferably used for forming a light emitting layer of an active region of an LED epitaxial wafer. Therefore, the substrate may be a silicon substrate or a sapphire substrate; the surface of the silicon substrate may be any crystal plane of {110}, {111}, {001}, {211}, {311}, {337} and {5 5 12} families of planes; and the surface of the sapphire substrate may be any crystal plane of {1$\bar{1}$02}, {11$\bar{2}$3}, {10$\bar{1}$0} and {11$\bar{2}$1} families of planes, or any crystal plane of {10$\bar{1}$0} and {11$\bar{2}$0} families of planes (i.e., m-plane and a-plane).

Step S203: the thermoplastic material layer is heated to a temperature above a glass transition temperature of the thermoplastic material, and the mold is pressed onto the thermoplastic material layer to fill the thermoplastic material layer into the pattern of the mold.

Step S204: the thermoplastic material layer is cured by cooling, and then the mold is removed to form a third mask layer having a three-dimensional pattern on the substrate.

Step S205: the third mask layer and the substrate are etched to transfer the pattern to the substrate so as to form the plurality of zigzag structures on a surface of the substrate. An etching method may be a dry etching or a wet etching. During the etching process, the pattern of the third mask layer is preserved and transferred to the surface of the substrate to form the required zigzag convex structures on the surface of the substrate finally.

In some embodiments, by using any of the two methods, a plurality of zigzag structures arranged in a two-dimensional array may be formed on the surface of the substrate. After forming the plurality of zigzag structures, both methods may further comprise: anodizing each zigzag structure to form a porous structure; and annealing each porous structure in the ambient containing hydrogen to form a surface of each porous structure as a plane.

In some embodiments, after forming the plurality of zigzag structures by using any of the two methods, both methods further comprise: forming a first mask layer on each second surface.

In some embodiments, after forming the plurality of zigzag structures by using any of the two methods, both methods further comprise: growing a compound semiconductor layer on each first surface by using each first surface as a growth surface. In one embodiment, a material of the compound semiconductor layer comprises a nitride-based compound semiconductor material, such as GaN with a non-polar or semi-polar surface, for example, an m-plane, an a-plane, or a r-plane, even if the growth plane (each first surface) is polar (such as a c-plane). In one embodiment, if a height of the compound semiconductor layer grown on each first surface in a direction perpendicular to each first surface is not greater than a length of each first short side, the compound semiconductor layers formed on adjacent first surfaces may be separated from each other. In another embodiment, if the height of the compound semiconductor layer grown on each first surface in the direction perpendicular to each first surface is greater than the length of each first short side, the compound semiconductor layers formed on adjacent first surfaces may be connected with each other to form a global compound semiconductor layer. The separated compound semiconductor layers or the global compound semiconductor layer is the non-polar or semi-polar surface identical with the original crystal plane of the substrate.

In addition, as mentioned above, in one embodiment, the semiconductor structure is preferably used for forming a light emitting layer of an active region of an LED epitaxial wafer. Therefore, in one embodiment, when the substrate is a silicon substrate and the surface of the silicon substrate is any crystal plane of $\{110\}$, $\{111\}$, $\{001\}$, $\{211\}$, $\{311\}$, $\{337\}$ and $\{5\ 5\ 12\}$ families of planes, each first surface may be any crystal plane of $\{111\}$ and $\{110\}$ families of planes. In another embodiment, when the substrate is a sapphire substrate and the surface of the sapphire substrate is any crystal plane of $\{1\bar{1}02\}$, $\{11\bar{2}3\}$, $\{10\bar{1}0\}$ and $\{11\bar{2}1\}$ families of planes, each first surface may be a crystal plane (0001); or when the surface of the sapphire substrate is any crystal plane of $\{10\bar{1}\}$ and $\{11\bar{2}\}$ families of planes, each first surface may be any crystal plane of $\{1\bar{1}02\}$, $\{11\bar{2}3\}$, $\{10\bar{1}0\}$ and $\{11\bar{2}1\}$ families of planes (i.e., m-plane and a-plane). A high-quality film such as a non-polar or semi-polar GaN film may be formed on each first surface by epitaxial growth. During the epitaxial process, by process controlling, the crystal plane of the epitaxial film may be gradually changed from being parallel to the first surface of each zigzag structure to being parallel to the original crystal plane of the substrate, which means that the crystal plane of the epitaxial film may be non-polar or semi-polar even if the growth plane is polar. For example, even though the growth plane is parallel to the polar plane (c-plane), a non-polar or semi-polar GaN film may be formed by epitaxial growth on the zigzag structure if the substrate surface is parallel to non-polar plane (a-plane and m-plane) or semi-polar plane (r-plane) of GaN film.

With the semiconductor structure and the method for forming the same according to embodiments of the present disclosure, by transferring the patterned structure of the special shape onto the mask of the substrate via the nanoimprint lithography process and then pattern-preserving etching, the plurality of growth planes at a determinate angle to the original crystal plane of the substrate are introduced on the substrate. Furthermore, a compound semiconductor layer is formed on the required growth planes by an epitaxial growth process, which may have a non-polar or semi-polar surface identical with the original crystal plane of the substrate. By process controlling, the crystal plane of the compound semiconductor layer may be parallel to the original crystal plane of the substrate and be non-polar or semi-polar. By fabricating the non-polar or semi-polar LED device on the semiconductor structure, the quantum efficiency of the light emitting layer of the active region may be greatly raised, thus raising the light emitting efficiency of the LED device greatly. In addition, almost any required crystal plane may be obtained on any orientation substrate by using the method according to embodiments of the present disclosure.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A semiconductor structure, comprising:
    a substrate; and
    a plurality of zigzag structures formed on a surface of the substrate, wherein each zigzag structure has a first long side and a first short side, the first long side of one zigzag structure is adjacent to the first short side of another zigzag structure adjacent to the one zigzag structure, each first long side defines a first surface of each zigzag structure, each first short side defines a second surface of each zigzag structure, and each first surface is a growth surface for a compound semiconductor layer, while each second surface is not a growth surface for the compound semiconductor layer.

2. The semiconductor structure according to claim 1, wherein each zigzag structure has a porous structure.

3. The semiconductor structure according to claim 2, wherein a surface of each porous structure is a plane formed by annealing in an ambient containing hydrogen.

4. The semiconductor structure according to claim 1, wherein a material of the compound semiconductor layer comprises a nitride-based compound semiconductor material.

5. The semiconductor structure according to claim 1, wherein each zigzag structure is formed by a nanoimprint lithography process.

6. The semiconductor structure according to claim 1, wherein a height of the compound semiconductor layer grown on each first surface in a direction perpendicular to each first surface is not greater than a length of each first short side so as to enable the compound semiconductor layers formed on adjacent first surfaces to be separated from each other; or the height of the compound semiconductor layer grown on each first surface in the direction perpendicular to each first surface is greater than the length of each first short side so as to enable the compound semiconductor layers formed on adjacent first surfaces to be connected with each other to form a global compound semiconductor layer.

7. The semiconductor structure according to claim 1, wherein
    the substrate is a silicon substrate, the surface of the substrate is any crystal plane of $\{110\}$, $\{111\ \}$, $\{001\ \}$, $\{211\ \}$, $\{311\ \}$, $\{337\}$ and $\{5\ 5\ 12\}$ families of planes, and each first surface is any crystal plane of $\{111\}$ and $\{110\}$ families of planes; or the substrate is a sapphire substrate, and
the surface of the substrate is any crystal plane of $\{1\bar{1}02\}$, $\{11\bar{2}3\}$, $\{10\bar{1}0\}$ and $\{11\bar{2}1\}$ families of planes, and each first surface is a crystal plane (0001), or
the surface of the substrate is any crystal plane of $\{10\bar{1}0\}$ and $\{11\bar{2}0\}$ families of planes, and each first surface is any crystal plane of $\{1\bar{1}02\}$, $\{11\bar{2}3\}$, $\{10\bar{1}0\}$ and $\{11\bar{2}1\}$ families of planes.

8. A semiconductor structure, comprising:
a substrate; and
a plurality of zigzag structures formed on a surface of the substrate, wherein each zigzag structure has a first long side and a first short side, the first long side of one zigzag structure is adjacent to the first short side of another zigzag structure adjacent to the one zigzag structure, each first long side defines a first surface of each zigzag structure, each first short side defines a second surface of each zigzag structure, each first surface is a growth surface for a compound semiconductor layer, and a first mask layer is formed on each second surface to prevent the compound semiconductor layer from growing on each second surface.

\* \* \* \* \*

UNITED STATES PATENT AND TRADEMARK OFFICE
CERTIFICATE OF CORRECTION

PATENT NO.        : 9,312,427 B2
APPLICATION NO.   : 14/362079
DATED             : April 12, 2016
INVENTOR(S)       : Yuan Li et al.

Page 1 of 1

It is certified that error appears in the above-identified patent and that said Letters Patent is hereby corrected as shown below:

In the claims

Column 10, lines 64-65 delete "{111 }, {001 }, {211 }, {311 }" and insert therefor --{111}, {001}, {211}, {311}--.

Signed and Sealed this
Twenty-sixth Day of July, 2016

Michelle K. Lee
*Director of the United States Patent and Trademark Office*